(12) United States Patent
Komiya et al.

(10) Patent No.: US 11,184,146 B2
(45) Date of Patent: Nov. 23, 2021

(54) RECEPTION DEVICE

(71) Applicant: ROHM CO., LTD., Kyoto (JP)

(72) Inventors: Toshihide Komiya, Kyoto (JP); Kenya Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/063,976

(22) Filed: Oct. 6, 2020

(65) Prior Publication Data

US 2021/0021403 A1 Jan. 21, 2021

Related U.S. Application Data

(63) Continuation of application No. PCT/JP2019/013562, filed on Mar. 28, 2019.

(30) Foreign Application Priority Data

Apr. 6, 2018 (JP) .............................. JP2018-073908

(51) Int. Cl.
| | | |
|---|---|---|
| *H04L 7/033* | (2006.01) | |
| *H03K 3/037* | (2006.01) | |
| *H03K 5/24* | (2006.01) | |
| *H04L 25/02* | (2006.01) | |

(52) U.S. Cl.
CPC ........... *H04L 7/0331* (2013.01); *H03K 3/037* (2013.01); *H03K 5/24* (2013.01); *H04L 25/0272* (2013.01)

(58) Field of Classification Search
CPC ............... H04L 7/0331; H04L 25/0272; H04L 25/0292; H04L 7/033; H03K 3/037; H03K 5/24
See application file for complete search history.

(56) References Cited

U.S. PATENT DOCUMENTS

| | | | | |
|---|---|---|---|---|
| 8,611,403 | B1 * | 12/2013 | Ding | ..................... G06F 1/3206 375/219 |
| 9,596,160 | B1 | 3/2017 | Li et al. | |
| 2005/0281193 | A1 * | 12/2005 | Hofmeister | ............. H04L 1/243 370/217 |

(Continued)

FOREIGN PATENT DOCUMENTS

| | | |
|---|---|---|
| JP | 2009159256 A | 7/2009 |
| JP | 2010212771 A | 9/2010 |
| WO | 2008099523 A1 | 8/2008 |

OTHER PUBLICATIONS

International Search Report for International Application No. PCT/JP2019/013562; dated Jun. 11, 2019.

(Continued)

*Primary Examiner* — Vineeta S Panwalkar
(74) *Attorney, Agent, or Firm* — Cantor Colburn LLP

(57) ABSTRACT

Differential input pins are coupled to a differential transmission path. A receiver circuit receives a differential input signal input via the differential input pins. A latch circuit latches an internal differential signal output from the receiver circuit. An evaluation circuit samples the internal differential signal, and generates evaluation data with respect to the waveform of the internal differential signal. A reception device is configured to be capable of providing evaluation data $D_{EVAL}$ to an external circuit.

12 Claims, 11 Drawing Sheets

(56) References Cited

U.S. PATENT DOCUMENTS

2009/0195272 A1\* 8/2009 Okuzono ................. G09G 3/20
 327/141
2019/0123726 A1\* 4/2019 Ray ........................ H03K 5/003
2020/0212943 A1\* 7/2020 Banin ..................... H04L 25/49

OTHER PUBLICATIONS

PCT International Preliminary Report on Patentability with Written Opinion of the International Searching Authority for International Application No. PCT/JP2019/013562, dated Oct. 15, 2020.
JPO Notice of Reasons for Refusal for corresponding JP Patent Application No. 2020-512200; dated Oct. 5, 2021.

\* cited by examiner

RECEPTION DEVICE

CROSS REFERENCE TO RELATED APPLICATIONS

This application is a continuation under 35 U.S.C. § 120 of PCT/JP2019/013562, filed Mar. 28, 2019, which is incorporated herein reference and which claimed priority to Japanese Application No. 2018-073908, filed Apr. 6, 2018. The present application likewise claims priority under 35 U.S.C. § 119 to Japanese Application No. 2018-073908, filed Apr. 6, 2018, the entire content of which is also incorporated herein by reference.

BACKGROUND

1. Technical Field

The present invention relates to a data transmission technique.

2. Description of the Related Art

In order to support high-speed data transmission between multiple semiconductor devices, a differential serial interface is widely employed. In particular, with a clockless transmission method employing a Clock Data Recovery (CDR) method, by transmitting serial data including embedded clock data, this arrangement supports such high-speed data transmission using a single differential line.

Applications of such a differential serial interface are seen to be expanding. For example, such a differential serial interface is employed to support data transmission between in-vehicle devices included in a vehicle. An AC-coupling interface is disclosed in Patent document (International Publication WO 2008/099523) that requires only a single transmission path to support bidirectional transmission.

FIG. 1 is a diagram showing a basic configuration of a differential transmission system. A differential transmission system 1R includes a transmission device 10, a reception device 20, and a differential transmission path 2. In a case in which the differential transmission path 2 has a length having non-negligible effects, i.e., in a case in which there are non-negligible effects of low-pass filters that occur due to parasitic resistances and parasitic capacitances that occur in the differential transmission path 2, this attenuates the high-frequency component of the transmitted serial signal. Accordingly, distortion of the waveform observed on a receiver side becomes conspicuous.

In some cases, in the design stage, in order to ensure sufficient line quality, the designer may want to measure a received waveform on the reception device 20 side. For example, in order to solve a problem of distortion of the waveform that occurs in the transmission path, a pre-emphasis circuit or a de-emphasis circuit is introduced on a transmitter side. The pre-emphasis circuit is provided in order to emphasize in advance high-frequency components that are attenuated in the transmission path. On the other hand, the de-emphasis circuit is provided on the transmitter side in order to attenuate in advance low-frequency components that involve relatively little attenuation in the transmission path. Waveform measurement on the receiving circuit side is effective for optimizing the parameters to be set for such a pre-emphasis circuit or a de-emphasis circuit.

FIG. 2 is a block diagram showing the reception device 20 that supports such waveform measurement. The reception device 20 receives a differential signal from the transmission device 10 via differential input pins INP and INN. The reception circuit 22 includes a fully differential amplifier (buffer), and receives the differential serial signal input via the differential input pins INP and INN. A latch circuit 24 converts an internal differential signal INTP and INTN output from the reception circuit into a single-ended reception signal, and latches the single-ended reception signal thus converted in synchronization with a clock signal.

With a Clock Data Recovery (CDR) method, a reception signal is latched using a multi-phase clock MCLK. An optimum reception signal is selected from among the multiple reception signals thus latched in the respective phase. The optimum reception signal thus selected is converted into parallel data by means of a serial/parallel converter 26 configured as a downstream stage.

In order to support the measurement of the received signal, the reception device 20 is provided with monitor pins MONP and MONN for the waveform measurement. A waveform measurement device 4 is coupled to the monitor pins MONP and MONN. The fully differential output buffer 28 receives the internal differential signal INTP and INTN, and outputs the internal differential signal thus received to the waveform measurement device 4 via the monitor pins MONP and MONN.

In a case in which the reception device 20 shown in FIG. 2 is employed, this allows the designer to evaluate an eye pattern (waveform) and the aperture ratio thereof using the waveform measurement device 4. However, such an arrangement has a problem of an increased number of pins required for the reception device 20. In addition, such an arrangement requires a high-cost waveform measurement device 4 in the waveform measurement.

SUMMARY

The present disclosure has been made in view of such a situation.

One embodiment of the present disclosure relates to a reception deice. The reception device includes: an input pin coupled to a transmission path; a receiver circuit structured to receive an input signal input via the input pin; a latch circuit structured to latch an internal signal output from the receiver circuit; and an evaluation circuit structured to sample the internal signal, and to generate evaluation data with respect to a waveform of the internal signal. The reception device is structured to be capable of providing the evaluation data to an external circuit.

It should be noted that any combination of the components described above or any manifestation thereof, may be mutually substituted between a method, apparatus, and so forth, which are also effective as one embodiment of the present disclosure.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of the Embodiments

Figure 1:
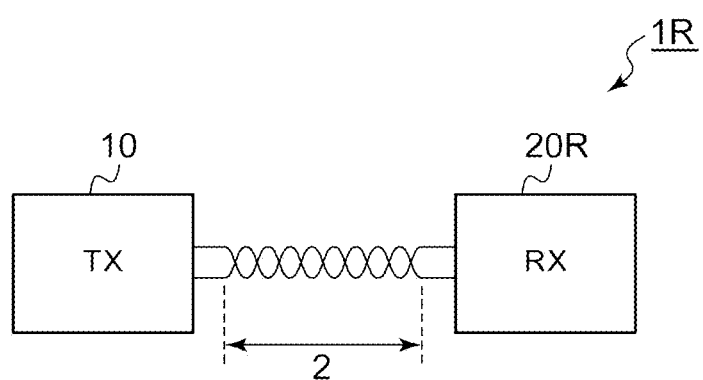
FIG. 1 is a diagram showing a basic configuration of a differential transmission system.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

One embodiment of the present disclosure relates to a reception deice. The reception device includes: an input pin coupled to a transmission path; a receiver circuit structured to receive an input signal input via the input pin; a latch circuit structured to latch an internal signal output from the receiver circuit; and an evaluation circuit structured to sample the internal signal, and to generate evaluation data with respect to a waveform of the internal signal. The reception device is structured to be capable of providing the evaluation data to an external circuit. By providing the reception device with a part of a hardware component required for waveform evaluation, such an arrangement enables waveform evaluation in a simple manner.

In one embodiment, the evaluation data may represent an eye pattern (eye diagram) of the internal signal. In a case in which such an eye pattern is generated, such an arrangement is capable of evaluating signal distortion that occurs in the transmission path, the bandwidth, and noise effects, based on the aperture ratio or the width of the eye pattern.

In one embodiment, the eye pattern may be represented such that, when the internal signal passes through a given plot, the plot is set to a first value, and such that when no internal signal passes through a given plot, the plot is set to a second value. This allows the size of the evaluation data to be compressed.

In one embodiment, the evaluation circuit may further include a Phase Locked Loop (PLL) circuit structured to generate a strobe signal that indicates a sampling timing.

In one embodiment, the reception device may be structured to be capable of inputting a reference clock of the PLL circuit as an external input.

In one embodiment, a reference clock of the PLL circuit may be embedded in the input signal.

In one embodiment, the evaluation circuit may include an A/D converter.

Embodiments

Description will be made below regarding the present disclosure based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present disclosure. Also, it is not necessarily essential for the present disclosure that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 3:
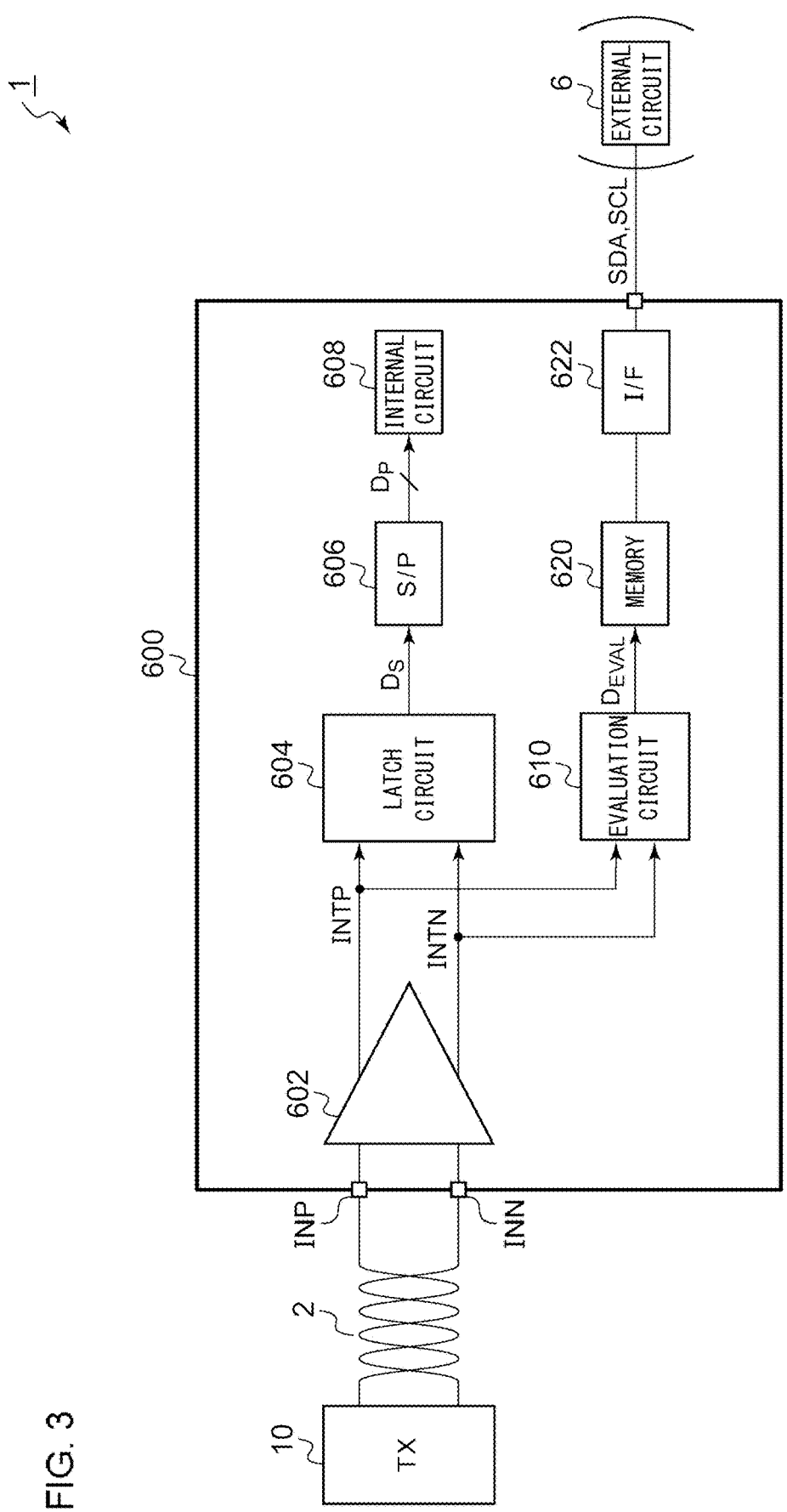
FIG. 3 is a block diagram showing a differential transmission system including a receiver circuit according to one embodiment.

FIG. 3 is a block diagram showing a differential transmission system 1 including a receiver circuit 600 according to one embodiment. The differential transmission system 1 includes a transmission device 10, a reception device 600, and a differential transmission path 2.

The transmission device 10 transmits differential serial data to the reception device 600 via the differential transmission path 2.

In order to support the serial data reception, the reception device 600 includes differential input pins INP/INN, a receiver circuit 602, a latch circuit 604, a serial/parallel converter 606, and an internal circuit 608. The differential input pins INP/INN are coupled to the differential transmission path 2.

The receiver circuit 602 receives a differential input signal input via the differential input pins INP/INN, and generates an internal differential signal INTP/INTN. The receiver circuit 602 may be configured as a differential buffer or a differential equalizer circuit.

The latch circuit 604 is configured as a latch converter that supports differential input. The latch circuit 604 receives the internal differential signal INTP/INTN, and converts the difference (INTP−INTN) into a binary signal that exhibits a high level (1) or a low level (0). Furthermore, the latch circuit 604 latches the binary signal thus converted in synchronization with a serial clock CKs, thereby converting the internal differential signal INTP/INTN into serial data Ds. The serial clock CKs may be supplied from the transmission device 10 together with the differential input signal. Alternatively, the serial clock CKs may be embedded in the differential input signal INP/INN (CDR method). In this case, the reception device 600 is provided with a CDR circuit. The serial/parallel converter 606 converts the serial data Ds into parallel data Dp, and supplies the parallel data Dp thus converted to the internal circuit 608 of the reception device 600.

In order to support the waveform evaluation, the reception device 600 includes an evaluation circuit 610, a memory 620, and an interface circuit 622. The evaluation circuit 610 samples the internal differential signal INTP/INTN output from the receiver circuit 602, and generates evaluation data $D_{EVAL}$ with respect to the internal differential signal INTP/INTN. The reception device 600 is configured to provide the evaluation data $D_{EVAL}$ to an external circuit.

The memory 620 is configured as a register that stores the evaluation data $D_{EVAL}$. The memory 620 is coupled to the interface circuit 622, which allows an external circuit 6 to access the evaluation data $D_{EVAL}$. The interface circuit 622 may be configured as an Inter IC ($I^2C$) interface, Serial Peripheral Interface (SPI), or the like. It should be noted that the external circuit 6 may be coupled only in a design stage of the differential transmission system 1.

The above is the configuration of the reception device 600. Next, description will be made regarding the operation thereof.

Normal Operation

During normal operation, the evaluation circuit 610 is deactivated (disabled). The internal differential signal INTP/INTN output from the receiver circuit 602 is input to the latch circuit 604, and the parallel data Dp is supplied to the internal circuit 608.

Evaluation Of Differential Transmission System 1

During the design and evaluation of the differential transmission system 1, the evaluation circuit 610 is activated (enabled). The transmission device 10 transmits a test pattern of the differential serial data to the reception device 600. The test pattern is designed so as to include various kinds of transition patterns. For example, a pseudo random binary sequence (PRBS) signal may be employed.

The evaluation circuit 610 generates the evaluation data $D_{EVAL}$ with respect to the waveform of the test pattern, and stores the evaluation data $D_{EVAL}$ thus generated in the memory 620. After the test ends, the external circuit 6 accesses the memory 620 so as to read the evaluation data $D_{EVAL}$.

The above is the operation of the reception device 600. The reception device 600 is provided with a part of a hardware component required to evaluate the waveform. This enables the waveform evaluation in a simple manner. That is to say, a high-cost measurement device 4 such as that shown in FIG. 2 is not required.

Figure 2:
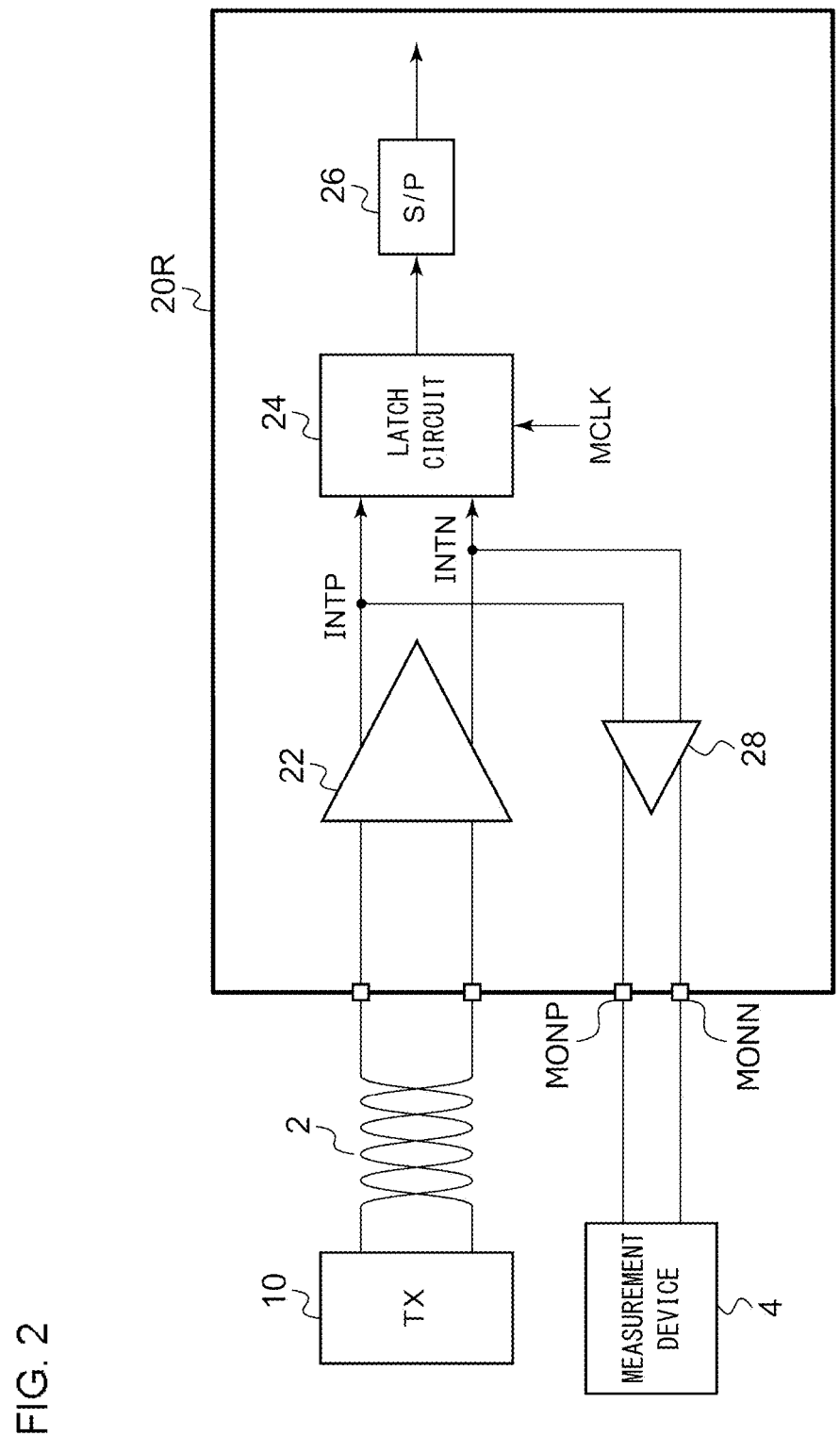
FIG. 2 is a block diagram showing a reception device that supports waveform measurement.

Furthermore, the reception device 600 shown in FIG. 3 does not require the monitor pins MONP/MONN for outputting the waveform as compared with the reception device 20 shown in FIG. 2. This allows the chip area or the package area to be reduced. In contrast, in many cases, the reception device 600 is provided with an $I^2C$ interface. In a case in which such an $I^2C$ interface is also used to output the evaluation data $D_{EVAL}$, the interface circuit 622 shown in FIG. 3 and the appended pins (SDA/SCL) thereof do not involve an increase in the circuit area.

Figure 4:
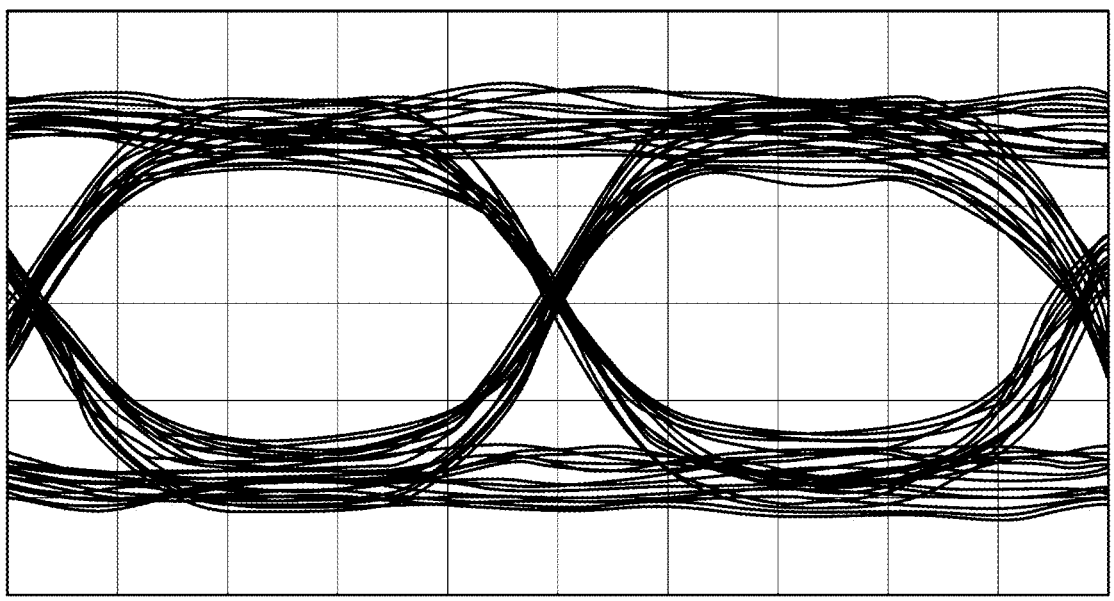
FIG. 4 is a diagram showing an example of an eye pattern.

Next, description will be made regarding the evaluation data. Preferably, the evaluation data $D_{EVAL}$ represents an eye pattern of the internal differential signal INT. FIG. 4 is a diagram showing an example of the eye pattern. The eye pattern is acquired by sampling and superimposing a large number of transition waveforms of the internal differential signal INTP/INTN. In the example shown in FIG. 4, the waveforms of two consecutive data symbols are superimposed.

Figure 5:
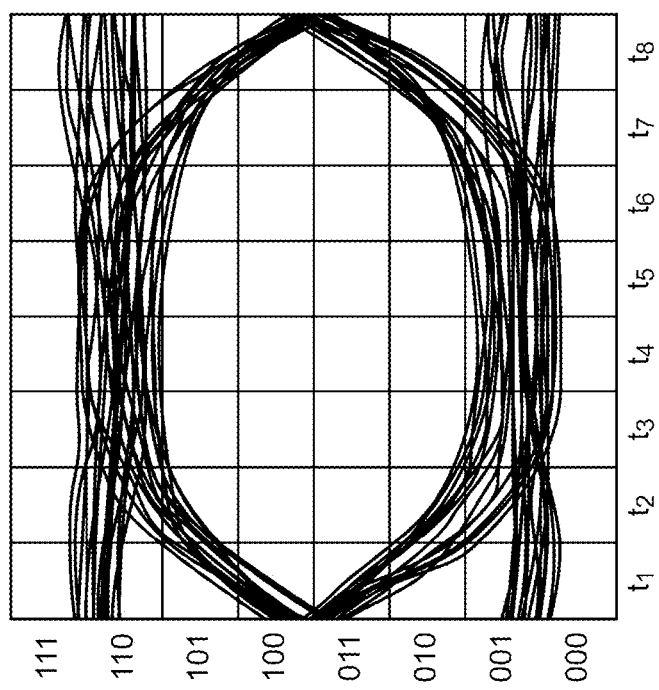
FIGS. 5A and 5B are diagrams for explaining an example of evaluation data $D_{EVAL}$.

FIG. 5A and FIG. 5B are diagrams for explaining an example of the evaluation data $D_{EVAL}$. The eye pattern shown in FIG. 5A includes multiple waveforms that correspond to multiple transitions. The evaluation circuit 610 may sample each of the multiple waveforms at M (M=8, in this example) different timings $t_1$ through $t_8$ defined along the time axis direction, and may digitize the waveform data thus sampled. Each waveform is quantized in an N-bit ($2^N$) range in the amplitude direction. In this case, as shown in FIG. 5B, the evaluation data $D_{EVAL}$ may be represented as a $M \times 2^N$ (8×8, in this example) matrix with the time axis direction as a column direction and with the amplitude direction as a row direction. When a given waveform passes through a given element of the matrix, the evaluation circuit 610 marks this element to a first value (e.g., a value of 1). Conversely, when no waveform passes through a given element of the matrix, the evaluation circuit 610 marks this element to a second value (e.g., a value of 0). Such processing is executed for all the waveforms, thereby acquiring the evaluation data $D_{EVAL}$.

The resolution M (sampling frequency) in the time axis direction may be on the order of 4 to 32 times the frequency fs of the serial data. Also, the resolution N in the amplitude direction may be on the order of 3 to 8 bits.

The evaluation data $D_{EVAL}$ requires only a small amount of data of ($M \times 2^N$ bits). This arrangement has an advantage of allowing the memory size of the memory 620 to be reduced.

Figure 6:
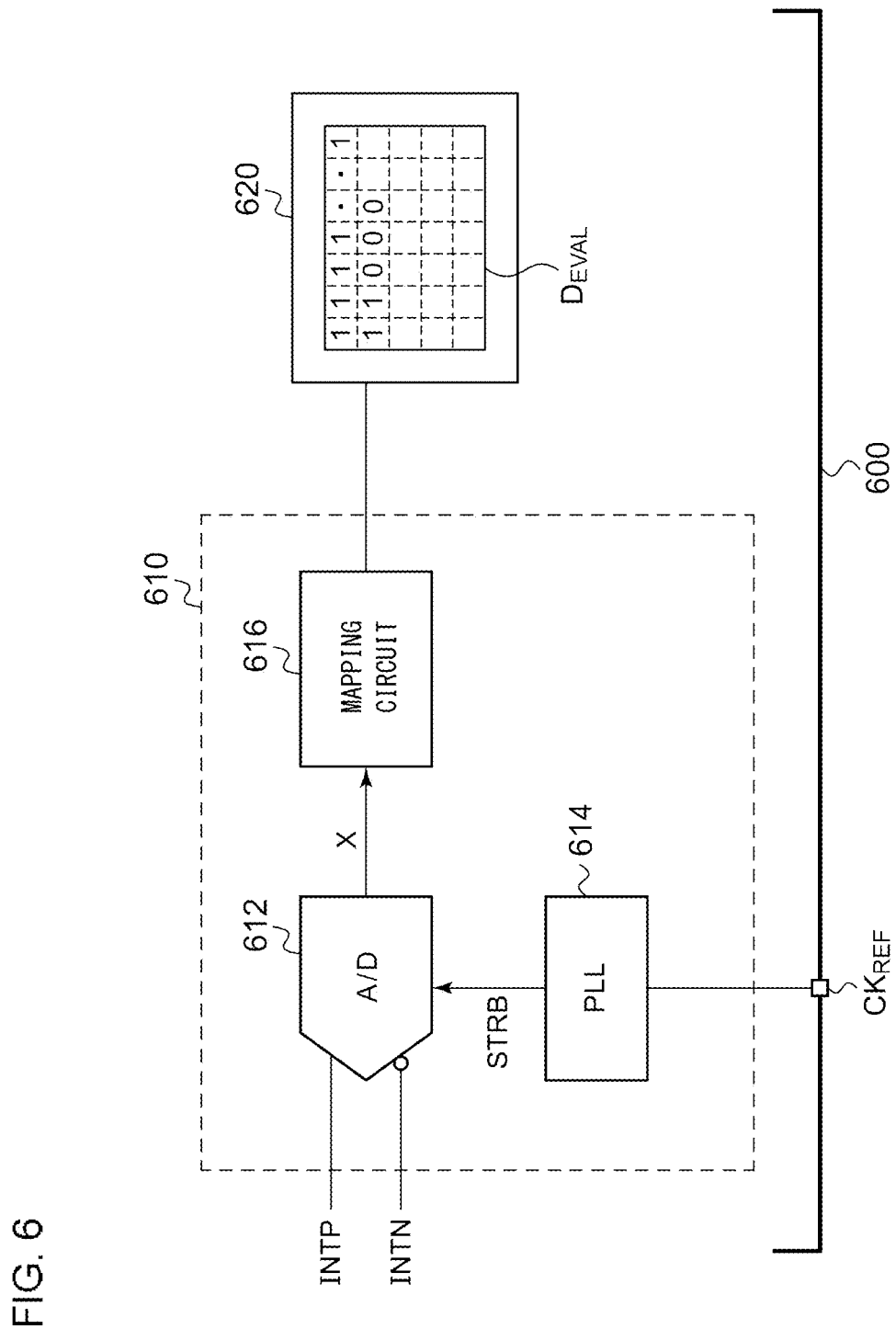
FIG. 6 is a circuit diagram showing an example configuration of an evaluation circuit.

FIG. 6 is a circuit diagram showing an example configuration of the evaluation circuit 610. The evaluation circuit 610 includes an A/D converter 612, a timing generator 614, and a mapping circuit 616. The A/D converter 612 is configured as a differential-input A/D converter that converts the internal differential signal INTP/INTN into a digital value at a timing that corresponds to a strobe signal STRB. The timing generator 614 generates the strobe signal STRB that indicates a sampling timing employed by the A/D converter 612. The timing generator 614 may include a PLL circuit that multiplies a reference clock $CK_{REF}$ supplied from a circuit external to the reception device 600 so as to generate the strobe signal STRB. Alternatively, the timing generator 614 may extract a clock embedded in the differential input signal (serial data) input via the differential input pins INP/INN, and multiply the clock thus extracted, so as to generate the strobe signal STRB.

Based on the digital value generated by the A/D converter 612, the mapping circuit 616 marks a corresponding element of the matrix MTRX of the evaluation data $D_{EVAL}$ shown in FIG. 5B stored in the memory 620. For example, the initial value of each element of the matrix is set to zero. When the digital value matches X (X=1, . . . , $2^N$) at the sampling timing $t_i$ (i=1, . . . , M), the mapping circuit 616 marks the element (i, X) to 1. This processing is repeated, thereby generating the evaluation data $D_{EVAL}$.

Figure 7A:
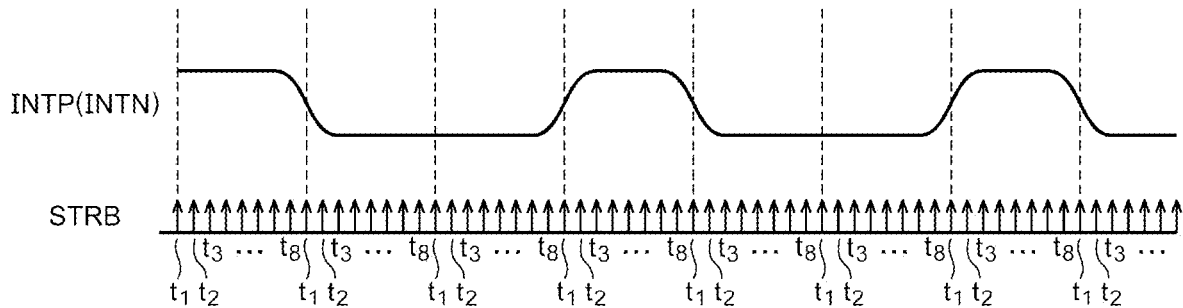
FIGS. 7A through 7C are time charts for explaining a first example operation through a third example operation of the evaluation circuit.

FIG. 7A is a time chart for explaining a first example operation of the evaluation circuit 610. In a case in which the A/D converter 612 has a maximum operation frequency that is sufficiently higher than the frequency of the internal differential signal INTP/INTN, the strobe signal STRB may be designed to have a frequency of fs×M (M=4, in the example shown in FIG. 7A).

Figure 7B:
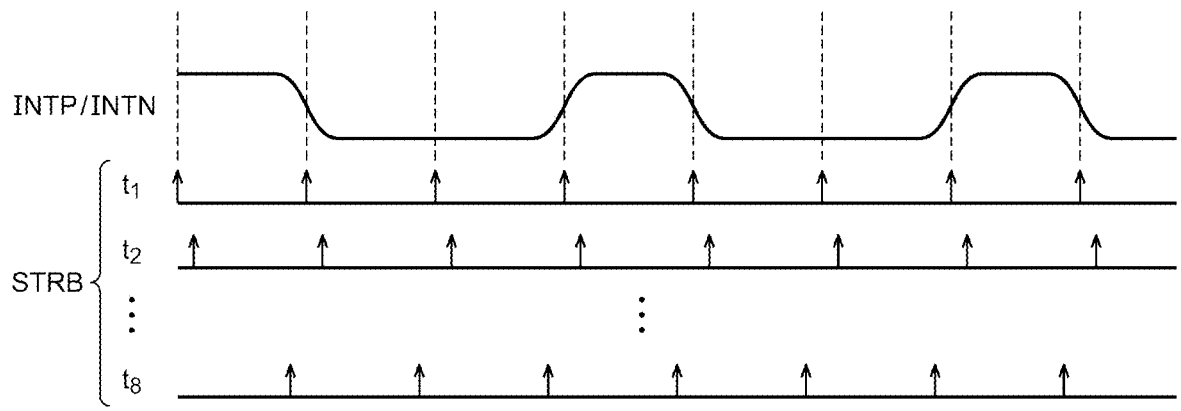

FIG. 7B is a time chart for explaining a second example operation of the evaluation circuit 610. In a case in which the A/D converter 612 has a maximum operation frequency that is approximately the same as the frequency of the internal differential signal INTP/INTN, the strobe signal STRB may be designed to have a frequency of fs (M=8, in the example shown in FIG. 7B). By shifting the phase of the strobe signal STRB by $t_1, t_2, \ldots, t_M$, this arrangement is capable of generating the evaluation data $D_{EVAL}$.

Figure 7C:
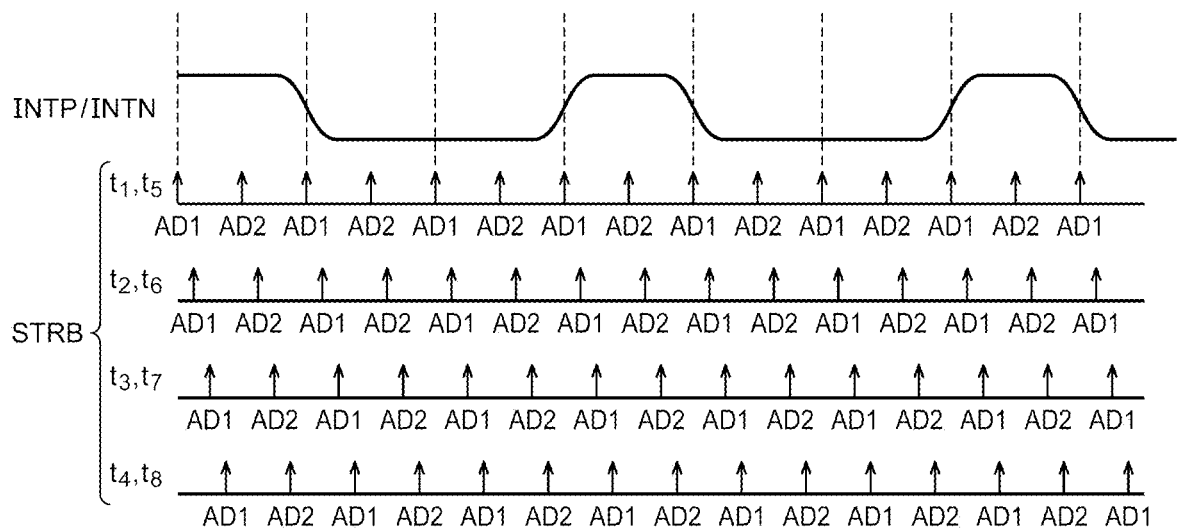

FIG. 7C is a time chart for explaining a third example operation of the evaluation circuit 610. The evaluation circuit 610 may include multiple (two, in this example) A/D converters configured to operate in a parallel manner. In this case, a first converter may sample the waveform at a timing $t_i$ (i=1, 2, ...). Furthermore, a second converter may sample the waveform at a timing $t_j$ (j=1, 2, ..., where j≠i). The operations of the first and second converters may be repeated. By repeating this operation while shifting i and j, this arrangement is capable of generating the evaluation data $D_{EVAL}$.

Figure 8:
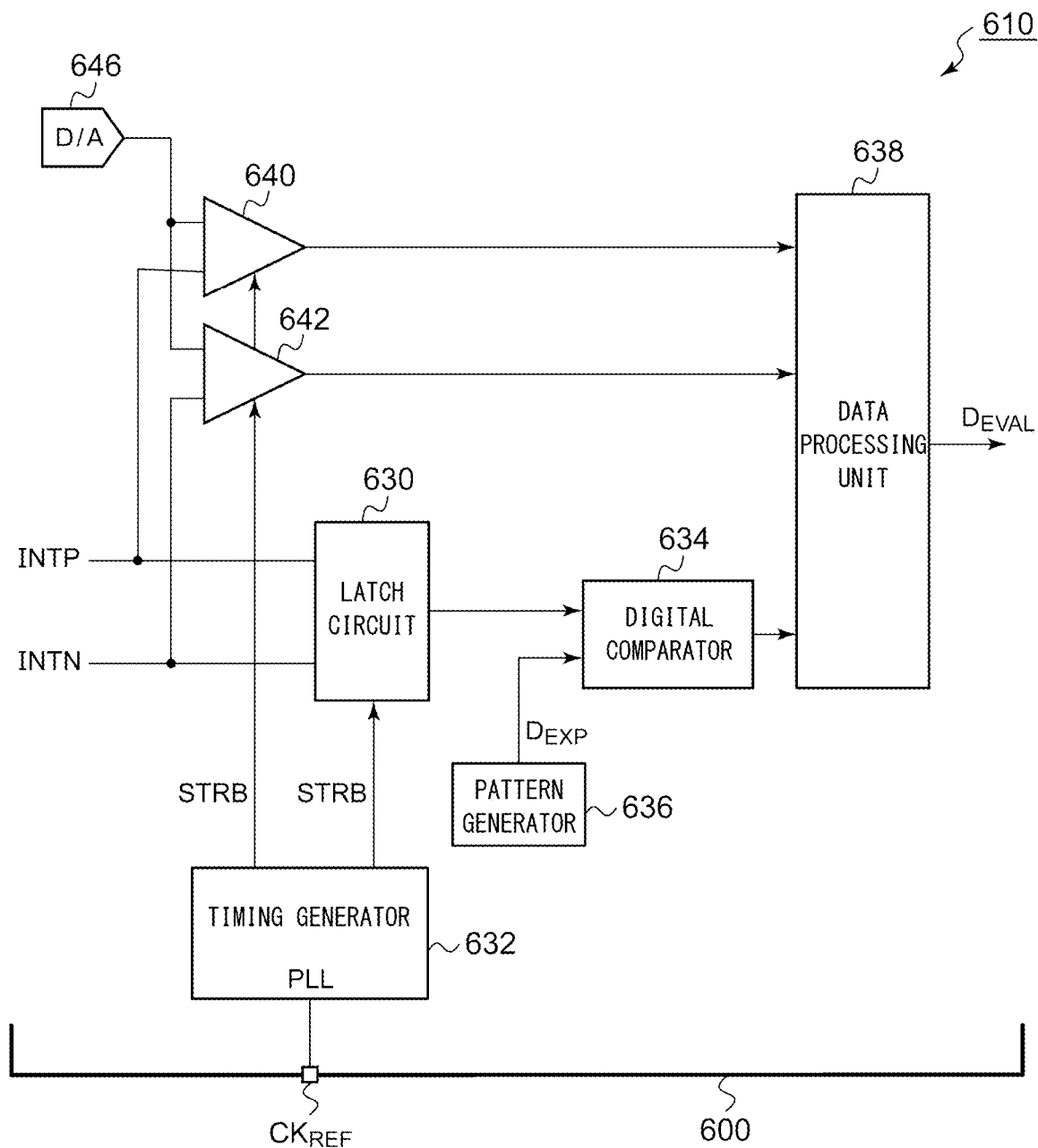
FIG. 8 is a circuit diagram showing another example configuration of the evaluation circuit.

FIG. 8 is a circuit diagram showing another example configuration of the evaluation circuit 610. A timing generator 632 generates the strobe signal STRB with a controllable phase. The timing generator 632 may be configured as a PLL circuit, or may be configured as a CDR circuit. For example, the timing generator 632 may generate a multiphase clock. The multiplexer may select, from the multiphase clock thus generated, a phase to be output as the strobe signal SRRB.

The latch circuit 630 is configured as a differential-input latch comparator. The latch circuit 630 latches the state of the internal differential signal INTP/INTN at a timing indicated by the strobe signal SRRB, so as to generate the serial data $D_S$. A single latch circuit may be shared as the latch circuit 630 and the latch circuit 604. Alternatively, the latch circuit 630 may be configured as a separate latch circuit from the latch circuit 604.

The pattern generator 636 generates an expected value pattern including an expected value $D_{EXP}$ of the serial signal to be received by the reception device 600. The digital comparator 634 compares the serial data $D_S$ latched by the latch circuit 630 with the expected value data $D_{EXP}$ for each bit, and generates judgment data $D_J$ that indicates a pass/fail result. In a case in which the timing generator 632 shifts the sampling timing defined by the strobe signal STRB in the time axis direction by $t_1, t_2, \ldots, t_8$ as shown in FIG. 5A, as the deviation from the center of the eye aperture becomes larger, the fail ratio becomes larger. The relation between the timing indicated by of the strobe signal STRB and the fail ratio (or pass ratio) may be output as the evaluation data $D_{EVAL}$. The evaluation data $D_{EVAL}$ represents the aperture ratio in the time-axis direction, i.e., the timing margin.

The D/A converter 646 generates a threshold voltage $V_{TH}$ that corresponds to a control code CODE. Comparators 640 and 642 respectively compare the internal differential signals INTP and INTN with the threshold voltage $V_{TH}$ at a timing indicated by the strobe signal STRB. For example, the control code CODE, i.e., the threshold voltage $V_{TH}$, is changed in a state in which the timing indicated by the strobe signal STRB is fixed to the center of the symbol ($t_4$ or $t_5$). This arrangement is capable of detecting the aperture ratio in the amplitude direction. The aperture ratio thus detected may be employed as the evaluation data $D_{EVAL}$.

Alternatively, in a case in which the threshold voltage $V_{TH}$ and the timing indicated by the strobe signal STRB are changed in a matrix manner, such an arrangement is capable of generating the evaluation data $D_{EVAL}$ shown in FIG. 5B.

Next, description will be made regarding the usage of the reception device 600.

Configuration of Bidirectional Transmission System 100

Figure 9:
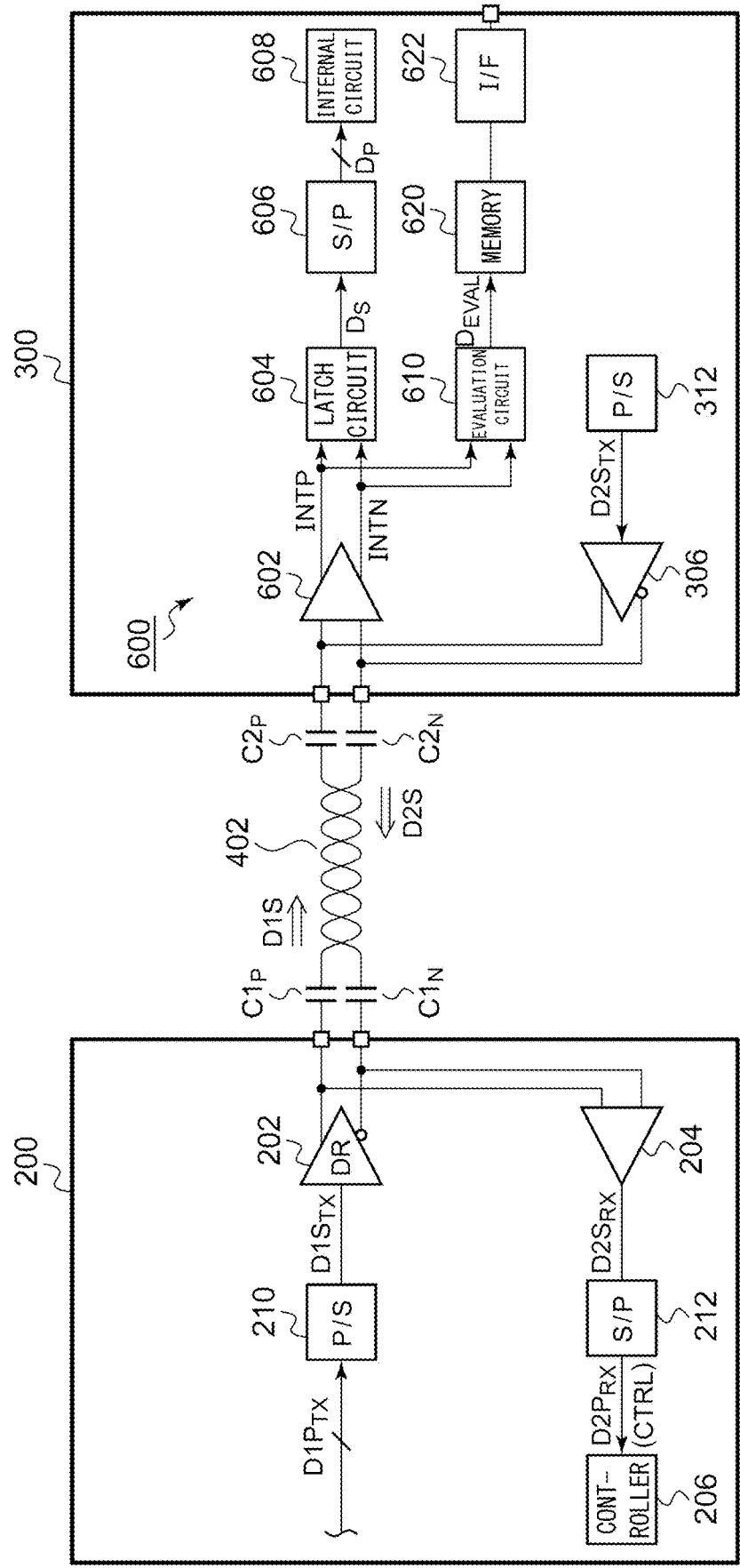
FIG. 9 is a block diagram showing a bidirectional transmission system.

FIG. 9 is a block diagram showing a bidirectional transmission system 100 according to one embodiment. The bidirectional transmission system 100 includes a first circuit 200 and a second circuit 300 coupled to each other via a differential transmission path 102. The first circuit 200 is coupled to a corresponding one end of the differential transmission path 102 via capacitors C1P and C1N. The second circuit 300 is coupled to a corresponding one end of the differential transmission path 102 via capacitors C2P and C2N.

Bidirectional serial transmission is supported between the first circuit 200 and the second circuit 300. There may be a difference in the transmission rate between transmission from the first circuit 200 to the second circuit 300 and transmission from the second circuit 300 to the first circuit 200. For example, large-volume data such as image data is transmitted from the first circuit 200 to the second circuit 300 at several Gbps. On the other hand, control data for controlling the first circuit 200 or other circuits coupled to the first circuit 200 is transmitted from the second circuit 300 to the first circuit 200 at several dozen Mbps.

Configuration of First Circuit 200

The first circuit 200 includes a first driver 202, a first receiver 204, a controller 206, a parallel/serial converter 210, and a serial/parallel converter 212.

An internal component (or otherwise an external component) of the first circuit 200 generates first parallel data $D1P_{TX}$ to be transmitted to the second circuit 300. The content of the first parallel data $D1P_{TX}$ is not restricted in particular. Examples of the content of the first parallel data $D1P_{TX}$ include image data, audio data, and other kinds of data. The parallel/serial converter 210 converts the first parallel data $D1P_{TX}$ into first serial data $D1S_{TX}$. The first driver 202 is AC coupled to one end of the differential transmission path 102 via a capacitor. The first driver 202 drives the differential transmission path 102 according to the first serial data $D1S_{TX}$. As a result, the first serial data D1S is transmitted from the first circuit 200 to the second circuit 300.

Furthermore, second serial data D2S is transmitted from the second circuit 300 to the first circuit 200. The first receiver 204 is coupled to one end of the differential transmission path 102. The first receiver 204 receives the second serial data D2S transmitted from the second circuit 300.

The controller 206 controls the state of the first circuit 200 or an external circuit coupled to the first circuit 200 based on a control signal CTRL included in the second serial data D2S. Specifically, the received second serial data $D2S_{RX}$ may be converted by the serial/parallel converter 212 into second parallel data $D2P_{RX}$, and the control signal CTRL1 may be extracted from the second parallel data $D2P_{RX}$. The above is the configuration of the first circuit 200.

Configuration of Second Circuit 300

Next, description will be made regarding a configuration of the second circuit 300. The second circuit 300 includes a second driver 306 and a parallel/serial converter 312 in addition to the reception device 600 described above.

The reception device 600 is coupled to the other end of the differential transmission path 102. The reception device 600 receives the first serial data D1S transmitted from the first circuit 200. The serial/parallel converter 606 converts the first serial data $D1S_{RX}$ latched by the latch circuit 604 into first parallel data $D1P_{RX}$. The first parallel data $D1P_{RX}$ is supplied to the internal circuit 608.

The parallel/serial converter 312 receives the control signal CTRL to be transmitted to the first circuit 200, and converts the control signal CTRL into second serial data $D2S_{TX}$ including the control signal CTRL. The second driver 306 is coupled to the other end of the differential transmission path 102. The second driver 306 drives the differential transmission path 102 according to the second serial data $D2S_{TX}$ including the control signal CTRL. The above is the configuration of the second circuit 300.

Figure 10:
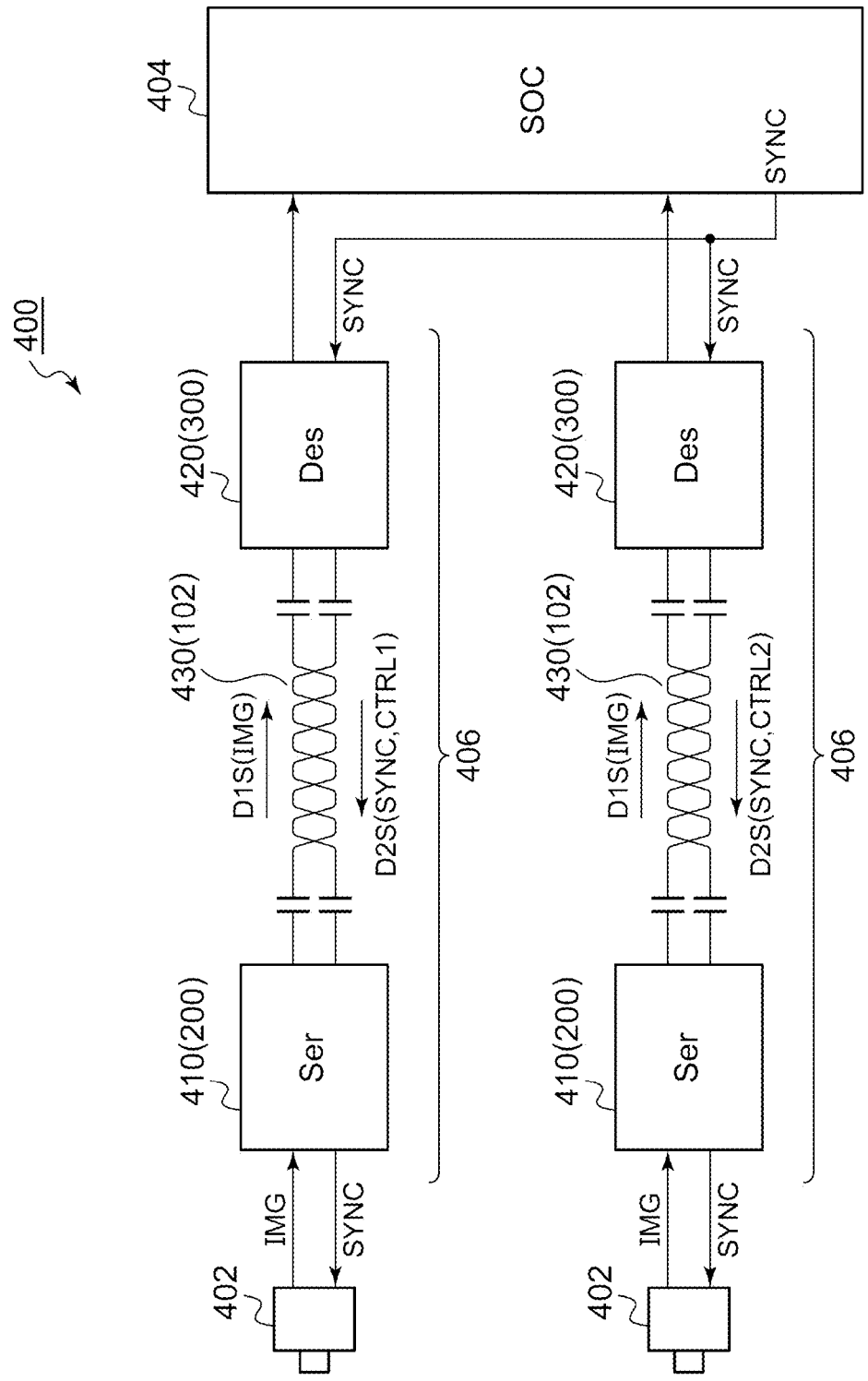
FIG. 10 is a block diagram showing an image processing system including the bidirectional transmission system shown in FIG. 9.

FIG. 10 is a block diagram showing an image processing system 400 including the bidirectional transmission system 100 shown in FIG. 9.

The image processing system 400 includes multiple cameras 402 and a System on Chip (SOC) 404. The SOC 404 performs predetermined image processing on image data IMG acquired by the multiple cameras 402. Furthermore, the SOC 404 supplies a signal (camera control signal) to the multiple cameras 402 so as to control the multiple cameras 402. For example, the image acquisition timings of the multiple cameras 402 are synchronized based on a synchronization signal SYNC, which is one of the camera control signals. FIG. 6 shows an arrangement including two cameras. The number of the cameras 402 mounted on the image processing system 400 may be greater than two. Also, only a single camera may be mounted on the image processing system 400.

In a case in which the distance between the cameras 402 and the SOC 404 is large, it is difficult for an interface circuit built into each camera 402 to accurately transmit the image data IMG to the SOC 404. On the other hand, it is difficult for an interface circuit built into the SOC 404 to accurately transmit a camera control signal to each camera 402. In such a usage, the above-described bidirectional transmission system 100 is preferably employed.

A bidirectional transmission system 406 is provided between each camera 402 and the SOC 404. The bidirectional transmission system 406 is configured using an architecture of the bidirectional transmission system 100 shown in FIG. 9. The bidirectional transmission system 406 transmits, as the first serial data D1S, the image data IMG received from the camera 402 to the SOC 404. Furthermore, the bidirectional transmission system 100 transmits the second serial data D2S including the synchronization signal SYNC to the camera 402.

The bidirectional transmission system 406 includes a serializer circuit 410, a deserializer circuit 420, and a differential transmission path 430. The serializer circuit 410 corresponds to the first circuit 200. The deserializer circuit 420 corresponds to the second circuit 300. The differential transmission path 430 corresponds to the differential transmission path 102.

In the normal operation mode, the serializer circuit 410 receives the image data IMG from the camera 402, converts the image data IMG into the first serial data D1S, and transmits the first serial data D1S to the deserializer circuit 420. The deserializer circuit 420 receives the first serial data D1S, and supplies the image data IMG to the SOC 404.

Furthermore, in the normal operation mode, the deserializer circuit 420 receives the camera control signal (synchronization signal SYNC) from the SOC 404, converts the camera control signal thus received into the second serial data D2S, and transmits the second serial data D2S to the serializer circuit 410.

In the design stage of the image processing system 400, the waveform of the internal differential signal INTP/INTN of the deserializer circuit 420 is measured. The external circuit 6 shown in FIG. 3 may be configured as the SOC 404 shown in FIG. 10. Also, the external circuit 6 may be configured as another circuit coupled instead of the SOC 404.

Figure 11:
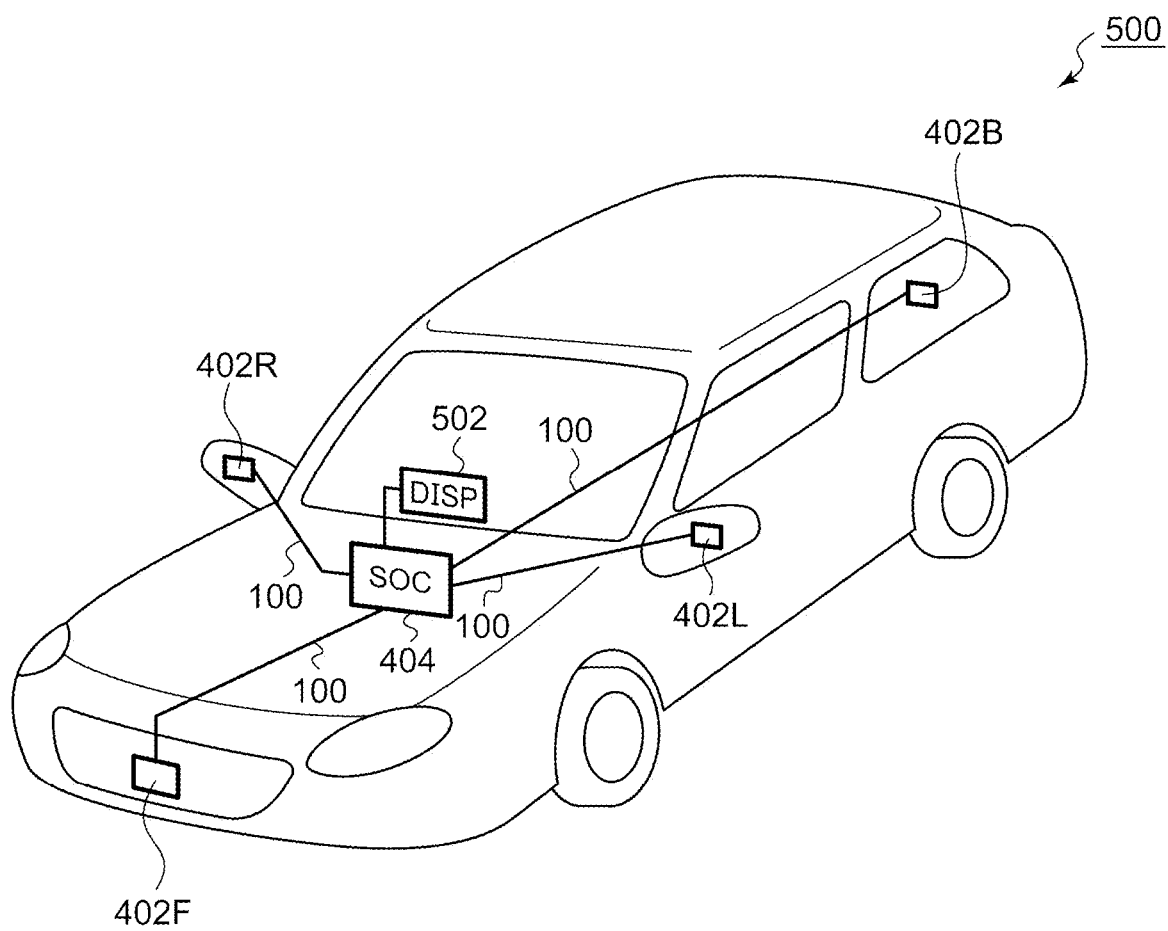
FIG. 11 is a diagram showing a vehicle including the image processing system shown in FIG. 10.

FIG. 11 is a diagram showing a vehicle including the image processing system 400 shown in FIG. 10. The vehicle 500 includes multiple cameras 402. Each camera 402 is coupled to the SOC 404 via the bidirectional transmission system 406. For example, the SOC 404 operates the multiple cameras 402 based on the driving state of the vehicle 500. For example, in the reverse driving mode, the SOC 404 displays the image acquired by the rear camera 402B on an in-vehicle display 502. Upon selecting an around-view monitoring mode when parking, the SOC 404 combines the multiple images received from the multiple cameras 402 so as to generate a composite image, and displays the composite image on the in-vehicle display 502.

Description has been made above regarding the present disclosure with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present disclosure. Description will be made below regarding such modifications.

Modification

Description has been made in the embodiment regarding an arrangement in which the eye pattern is represented in the form of a binary matrix. However, the present disclosure is not restricted to such an arrangement. For example, the evaluation data $D_{EVAL}$ may include multiple items of transition waveform data themselves included in the eye pattern. In a case in which the eye pattern includes K transition waveforms, and each waveform is quantized to $2^N$ bits in the amplitude direction and M points in the time-axis direction, the data amount of the evaluation data $D_{EVAL}$ is represented by $K \times 2^N \times M$ bits. Alternatively, for each of the timings $t_1$ through $t_M$, the evaluation data $D_{EVAL}$ may represent the internal waveform signal INTP/INTN in the form of a histogram with the amplitude as a class.

Also, the evaluation data $D_{EVAL}$ may represent the internal differential signal INTP/INTN in another form that differs from the eye pattern.

In a case in which there is no need to provide evaluation in the amplitude direction, in the evaluation circuit 610 shown in FIG. 8, the comparators 640 and 642 and the D/A converter 646 may be omitted. Conversely, in a case in which there is no need to provide evaluation in the time-axis direction, in the evaluation circuit 610 shown in FIG. 8, the latch circuit 630, the digital comparator 634, and the pattern generator 636 may be omitted.

Description has been made in the embodiment regarding an arrangement in which the input signal INP/INN and the internal signal INTP/INTN are each configured as a differential signal. However, the present disclosure is not restricted to such an arrangement. Also, the present disclosure may be applied to a system that transmits a single-ended input signal.

Description has been made with reference to FIG. 6 regarding an arrangement in which the evaluation circuit 610 is configured using an A/D converter. However, the present disclosure is not restricted to such an arrangement. For example, instead of such an A/D converter, the evaluation circuit 610 may be configured using a combination of a variable voltage source that generates a variable threshold voltage or a D/A converter and a comparator that compares the internal signal with the threshold voltage $V_{TH}$. For example, in a case in which the threshold voltage $V_{TH}$ is changed in a stepwise manner at a given strobe timing $t_j$, such an arrangement is capable of detecting the minimum value and the maximum value of the eye aperture. By repeating this measurement while shifting the strobe timing $t_j$, such an arrangement is capable of acquiring the shape of the eye aperture.

Description has been made regarding the present disclosure with reference to the embodiments using specific terms. However, the above-described embodiments show only an aspect of the mechanisms and applications of the present disclosure for exemplary purposes only, and are by no means intended to be interpreted restrictively. Rather, various modifications and various changes in the layout can be made without departing from the spirit and scope of the present disclosure defined in appended claims.

What is claimed is:

1. A reception device comprising:
an input pin to be coupled to a transmission path;
a receiver circuit structured to receive an input signal input via the input pin;
a latch circuit structured to latch an internal signal output from the receiver circuit; and
an evaluation circuit structured to sample the internal signal, and to generate evaluation data with respect to a waveform of the internal signal,
wherein the reception device is structured to be capable of providing the evaluation data to an external circuit, and
wherein the evaluation data represents an eye pattern of the internal signal, and wherein the eye pattern is represented such that, when the internal signal passes through a given plot, the plot is set to a first value, and such that when no internal signal passes through a given plot, the plot is set to a second value.

2. The reception device according to claim 1, wherein the evaluation circuit comprises an A/D converter.

3. The reception device according to claim 1, further comprising:
a memory structured to store the evaluation data; and
an interface circuit coupled to the memory.

4. The reception device according to claim 1, further comprising a driver that is coupled to the transmission path via the input pin, and that is structured to drive the transmission path according to serial data including a control signal.

5. The reception device according to claim 1, wherein the input signal and the internal signal are each configured as a differential signal.

6. A transmission system comprising:
a transmission device; and
the reception device according to claim 1, coupled to the transmission device via a transmission path.

7. A vehicle comprising:
at least one camera; and
the transmission system according to claim 6, structured to transmit an image acquired by the camera.

8. A reception device comprising:
an input pin to be coupled to a transmission path;
a receiver circuit structured to receive an input signal input via the input pin;
a latch circuit structured to latch an internal signal output from the receiver circuit; and
an evaluation circuit structured to sample the internal signal, and to generate evaluation data with respect to a waveform of the internal signal,
wherein the reception device is structured to be capable of providing the evaluation data to an external circuit,
wherein the evaluation circuit comprises a Phase Locked Loop (PLL) circuit structured to generate a strobe signal that indicates a sampling timing.

9. The reception device according to claim 8, structured to be capable of inputting a reference clock of the PLL circuit as an external input.

10. The reception device according to claim 8, wherein a reference clock of the PLL circuit is embedded in the input signal.

11. The reception device according to claim 8, wherein the evaluation circuit judges a pass/fail result of an output of the latch circuit while changing a phase of the strobe signal.

12. A reception device comprising:
an input pin to be coupled to a transmission path;
a receiver circuit structured to receive an input signal input via the input pin;
a latch circuit structured to latch an internal signal output from the receiver circuit; and
an evaluation circuit structured to sample the internal signal, and to generate evaluation data with respect to a waveform of the internal signal,
wherein the reception device is structured to be capable of providing the evaluation data to an external circuit,
wherein the evaluation circuit comprises:
a D/A converter structured to generate a threshold voltage that corresponds to a control code; and
a comparator structured to compare the internal signal with the threshold voltage.

* * * * *